United States Patent
Lunsman et al.

(10) Patent No.: US 12,408,303 B2
(45) Date of Patent: Sep. 2, 2025

(54) ELASTOMER EMBEDDED MULTIPOINT CONTACT COOLING

(71) Applicant: HEWLETT PACKARD ENTERPRISE DEVELOPMENT LP, Houston, TX (US)

(72) Inventors: Harvey J. Lunsman, Chippewa Falls, WI (US); Steven Dean, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 117 days.

(21) Appl. No.: 17/815,296

(22) Filed: Jul. 27, 2022

(65) Prior Publication Data
US 2024/0040748 A1    Feb. 1, 2024

(51) Int. Cl.
H05K 7/20    (2006.01)
H05K 1/02    (2006.01)

(52) U.S. Cl.
CPC ......... H05K 7/2039 (2013.01); H05K 1/0203 (2013.01)

(58) Field of Classification Search
CPC .... H05K 1/0203; H05K 1/181; H05K 7/2039; H05K 7/20472; H05K 7/20; H05K 7/14; H05K 7/20963; H05K 7/20445; H05K 7/20481; H05K 2201/10378; H05K 1/0204; H05K 7/20454; H05K 7/2049; H05K 7/20509; H05K 7/20463; H01L 23/3737; H01L 23/3736; H01L 23/36
See application file for complete search history.

(56) References Cited

U.S. PATENT DOCUMENTS

| 5,159,531 A | * | 10/1992 | Horvath | ............. H01L 23/3672 |
| | | | | 257/E23.09 |
| 5,365,402 A | * | 11/1994 | Hatada | ................... H01L 23/433 |
| | | | | 361/689 |
| 5,371,654 A | * | 12/1994 | Beaman | .............. H01L 23/5384 |
| | | | | 174/16.3 |

(Continued)

FOREIGN PATENT DOCUMENTS

| CN | 108511407 A | 9/2018 |
| EP | 2232969 A1 | 9/2010 |
| WO | 2009/082732 A1 | 7/2009 |

*Primary Examiner* — Adam B Dravininkas
(74) *Attorney, Agent, or Firm* — Hewlett Packard Enterprise Patent Department

(57) ABSTRACT

Example implementations relate to a cooling assembly of a host circuit device, a circuit assembly including the host circuit device and a removable circuit device, and a method for thermal management of the removable circuit device removably connected to the host circuit device. The cooling assembly includes a cooling component and a thermal gap pad having an elastomer component movably connected to the cooling component and a plurality of beams embedded in the elastomer component. Each beam includes a first end portion, a second end portion, and a body portion extended between the first and second end portions. The first end portion of each of one or more beams is disposed in a first thermal contact with the cooling component and a second end portion of each of the one or more beams is disposed in a second thermal contact with a heat sink of the removable circuit device.

15 Claims, 7 Drawing Sheets

(56) References Cited

U.S. PATENT DOCUMENTS

| | | | | |
|---|---|---|---|---|
| 5,548,090 | A | * | 8/1996 | Harris ................ H05K 7/20445 257/E23.09 |
| 5,695,847 | A | * | 12/1997 | Browne ............... H05K 1/0271 428/389 |
| 6,311,769 | B1 | | 11/2001 | Bonneville et al. |
| 6,854,985 | B1 | * | 2/2005 | Weiss ................ H01R 13/2414 439/91 |
| 7,167,379 | B2 | * | 1/2007 | DiBene, II ............. G06F 1/182 257/691 |
| 8,758,892 | B2 | | 6/2014 | Bergin et al. |
| 10,651,108 | B2 | | 5/2020 | Tang et al. |
| 2003/0234451 | A1 | * | 12/2003 | Razon .................... H01L 24/85 257/E23.068 |
| 2007/0204972 | A1 | * | 9/2007 | Edward .................. F28F 3/022 361/705 |
| 2014/0146479 | A1 | * | 5/2014 | Kilroy .................. H01L 23/433 361/717 |
| 2017/0164518 | A1 | * | 6/2017 | Morgan .................. G02B 6/43 |
| 2022/0091642 | A1 | * | 3/2022 | Lunsman ................. G06F 1/20 |
| 2022/0344239 | A1 | | 10/2022 | Lunsman et al. |

\* cited by examiner

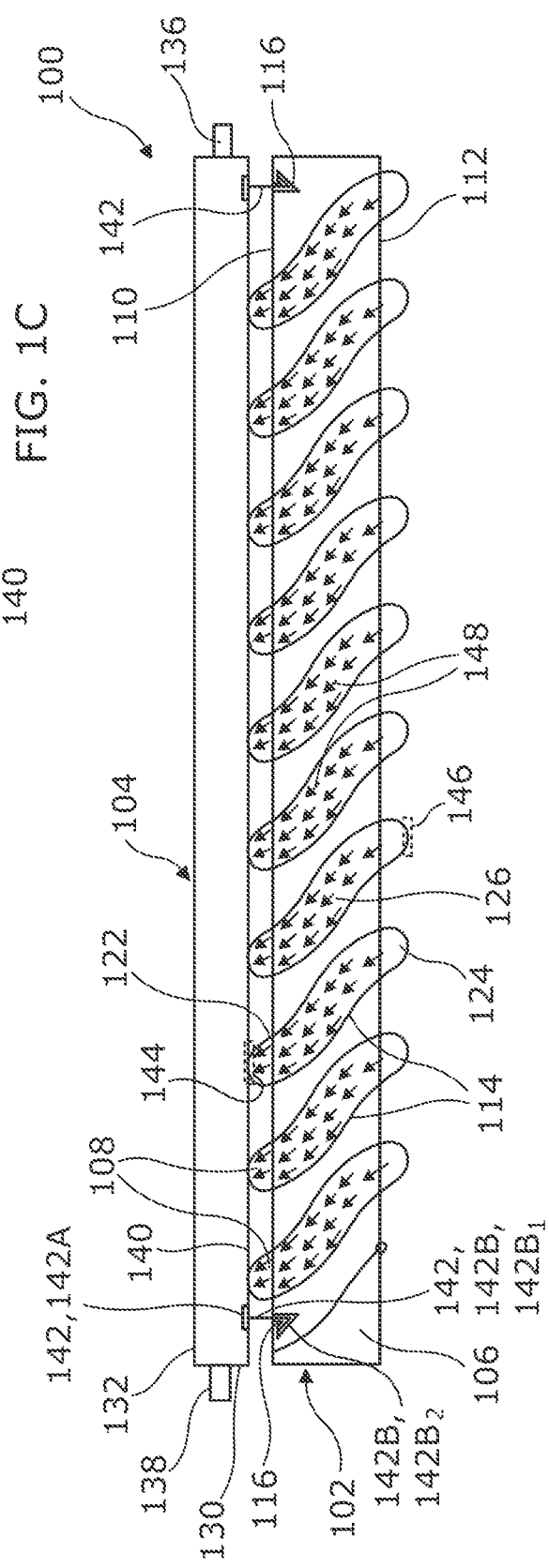
FIG. 1C
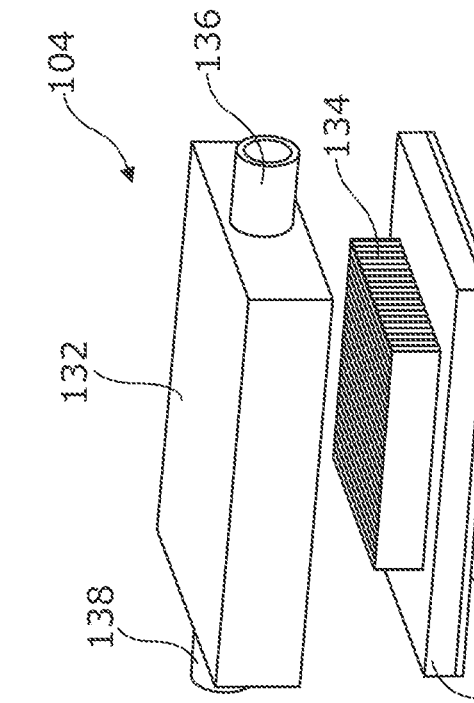
FIG. 1D
FIG. 1E

ELASTOMER EMBEDDED MULTIPOINT CONTACT COOLING

BACKGROUND

An electronic device, such as a computer, a networking device, etc., may include a circuit assembly including a printed circuit board with a circuit module to provision the electronic device to communicate with an external circuit module. The circuit module may include a networking switch, universal serial bus (USB) hub, or the like and the external circuit module may include a small form-factor pluggable (SFP) transceiver, a non-volatile memory express (NVMe) storage drive, or the like. The external circuit module, when connected to the circuit module, may produce waste heat during its operation. In order to minimize adverse effects of such waste heat on the external circuit module, the circuit assembly may include a cold plate to draw waste heat away from the external circuit module.

BRIEF DESCRIPTION OF THE DRAWINGS

Various examples will be described below with reference to the following figures.

FIG. 1C illustrates an exploded perspective view of a cooling component according to an example implementation of the present disclosure.

FIG. 1D illustrates an assembled perspective view of the cooling component of FIG. 1C according to an example implementation of the present disclosure.

FIG. 1E illustrates a block diagram of a cooling assembly including the thermal gap pad of FIGS. 1A-1B and the cooling component of FIGS. 1C-1D according to an example implementation of the present disclosure.

DETAILED DESCRIPTION

Figures 4A, 4B:
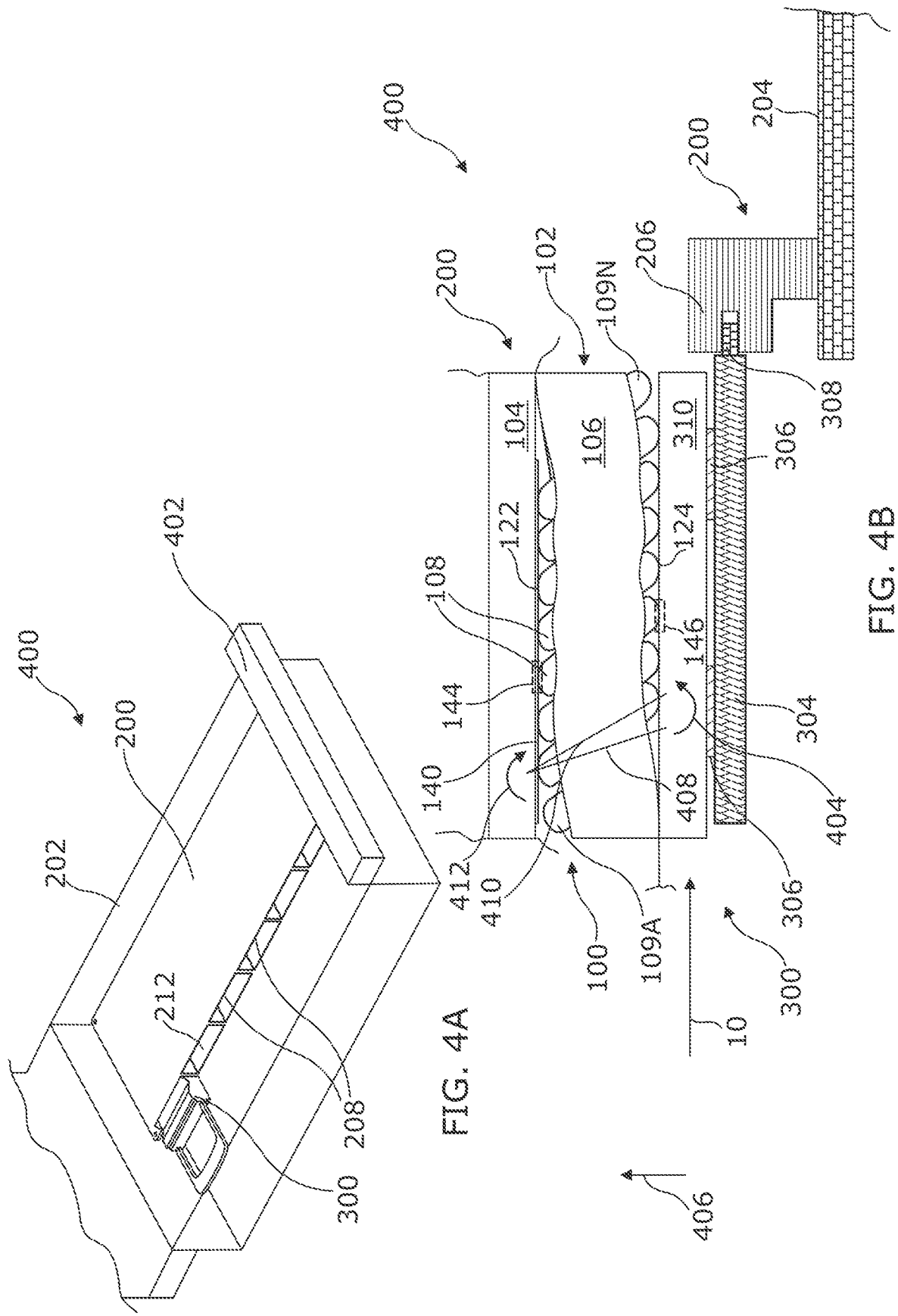
FIG. 4A illustrates a perspective view of a portion of a circuit assembly of an electronic device having the removable circuit device of FIG. 3 removably connected to the host circuit device of FIG. 2 according to an example implementation of the present disclosure.
FIG. 4B illustrates a block diagram of a portion of the circuit assembly of FIG. 4A having the cooling component of FIG. 1C in thermal contact with the heat sink of FIG. 3 via the thermal gap pad of FIG. 1B, and the circuit board of FIG. 3 communicatively connected to the host circuit board of FIG. 2 according to an example implementation of the present disclosure.
Figure 5:
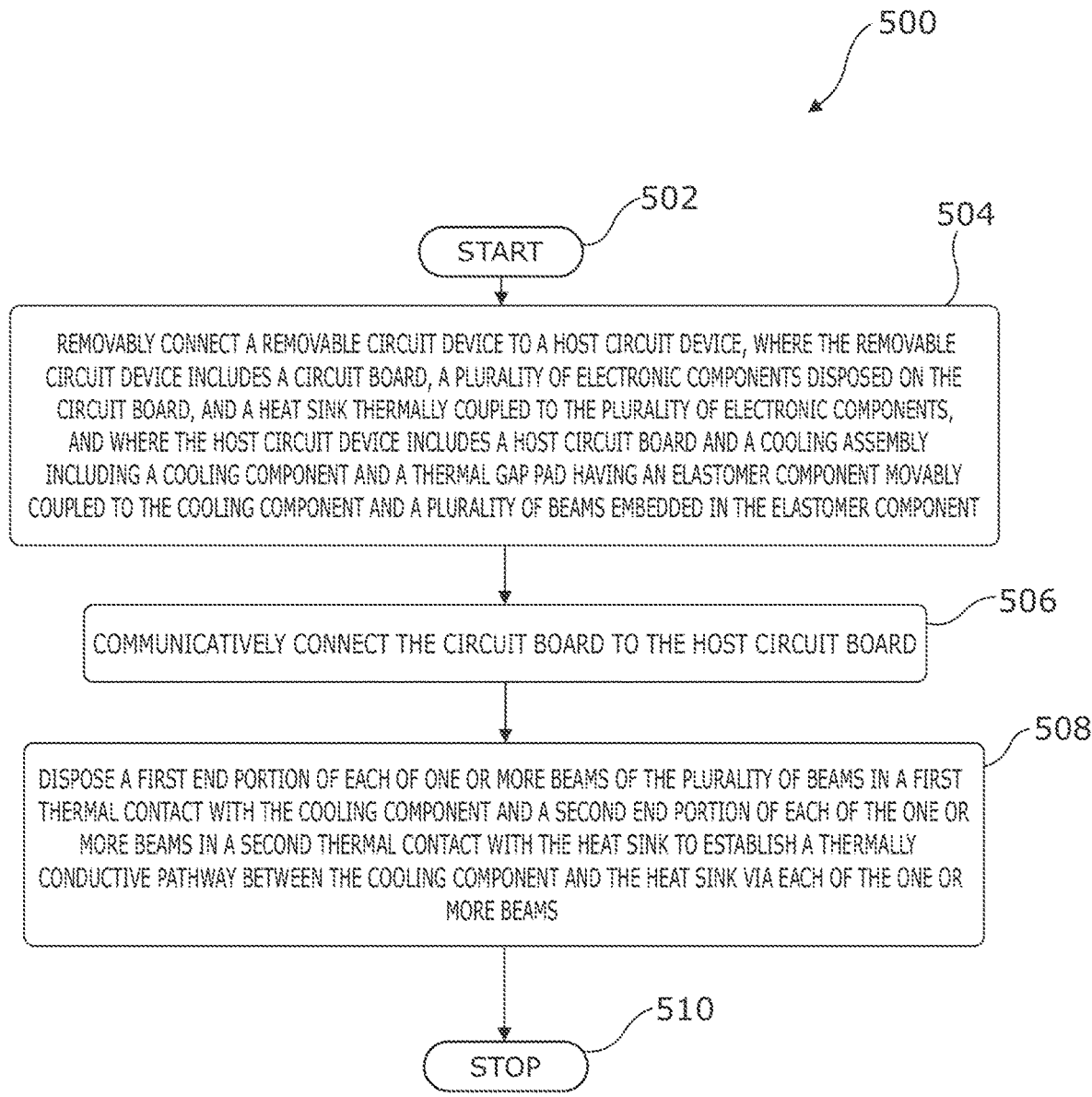
FIG. 5 illustrates a flowchart depicting a method of thermal management of a removable circuit device according to an example implementation of the present disclosure.

The following detailed description refers to the accompanying drawings. For purposes of explanation, certain examples are described with reference to the components illustrated in FIGS. 1-5. The functionality of the illustrated components may overlap, however, and may be present in a fewer or greater number of elements and components. Moreover, the disclosed examples may be implemented in various environments and are not limited to the illustrated examples. Further, the sequence of operations described in connection with FIG. 5 is an example and is not intended to be limiting. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

As used herein, "host circuit device" may refer to a circuit module hosted on a circuit assembly of an electronic device. For example, the host circuit device may include a networking switch, a universal serial bus (USB) hub, or the like. As used herein, "circuit assembly" refers to an electronic circuit having a printed circuit board, the host circuit device, and a removable circuit device, where the removable circuit device and the host circuit device may function as a plug and a socket respectively of the electronic device. As used herein, "removable circuit device" may refer to an external circuit module which may be to be connected to the circuit assembly by way of plugging into the host circuit device to transmit data, receive data, store data, or process data. For example, the removable circuit device may be a pluggable transceiver device or a pluggable storage drive, or the like. Accordingly, the host circuit device may be a native device of the electronic device and the removable circuit device may be an ancillary device of the electronic device. As used herein, "electronic device" may refer to a computer (a server or a storage device), a networking device (a wireless access point or router), or the like. Further, as used herein, "plugging" of a removable circuit device into a host circuit device may refer to fitting the removable circuit device into the host circuit device by way of inserting or sliding the plug of the removable circuit device into the socket of the host circuit device. Further, as used herein, "thermal contact" may refer to a thermally coupling between the surfaces of two components to establish a thermally conductive pathway between the two components that allows heat to be conducted between the two components. Two objects may be considered to be thermally coupled if any of the following are true: (1) the two objects are in contact with one another (either direct contact, or contact via a thermal interface material), (2) the objects are both thermally coupled to a thermally conductive intermediary (e.g., a heat pipe, heat spreader, etc.) (or to a chain of thermally conductive intermediaries thermally coupled together), or (3) a heat transfer coefficient between the two objects is 5 $W \cdot m^{-2} \cdot K^{-1}$ or greater. For example, a first thermal contact may be formed by the contact of a first end portion of each of one or more beams of a thermal gap pad with a cooling component, and a second thermal contact may be formed by the contact of a second end portion of each of the one or more beams with a heat sink of the removable circuit device. As used herein, "cold plate" is sometimes used in the art with varying meanings, with some meanings being more generic and others being more specific. As used herein, "cold plate" refers specifically to a subset of thermal devices that are configured to receive waste heat from a component via conduction and to dissipate that waste heat into a flow of liquid coolant (e.g., water), in contrast to a "heat sink" which as used herein refers specifically to a subset of thermal devices that are configured to receive waste heat from a component via conduction and transfer that waste heat to the cold plate that is thermally coupled to the heat sink.

An object, device, or assembly (which may include multiple distinct bodies that are thermally coupled, and may include multiple different materials), is "thermally conductive" between two thermal interfaces if any one of the following is true: (i) a heat transfer co-efficient between the thermal interfaces is 5 $W \cdot m^{-2} \cdot K^{-1}$ or greater at any temperature between 0° C. and 100° C., (ii) the object includes a material that has a thermal conductivity (often denoted k, $\lambda$, or $\kappa$) between the two interfaces is 1 $W \cdot m^{-1} \cdot K^{-1}$ or greater at any temperature between 0° C. and 100° C., or (iii) the object is a heat pipe, vapor chamber, body of copper, or body of aluminum. Examples of materials whose thermal conductivity greater than 1 $W \cdot m^{-1} \cdot K^{-1}$ between 0° C. and 100° C. include almost all metals and their alloys (e.g., copper, aluminum, gold, etc.), some plastics (e.g., TECACOMP® TC compounds, CoolPoly® D-series Thermally Conductive Plastics), and many other materials.

An electronic device may include a circuit assembly to host a circuit module (e.g., a host circuit device). The host circuit device may provision the electronic device to communicate with an external circuit module (e.g., a removable circuit device). The removable circuit device may be removably connected to the host circuit device to perform various functions, such as transfer data, receive data, process data, store data, or the like. Typically, the removable circuit device converts electrical signals into optical signals or vice versa, to perform the various functions discussed herein, and produces waste heat during its operation. If such waste heat is not removed from the removable circuit device, the waste heat may exceed thermal specifications of electronic components of the removable circuit device, thereby resulting in degraded performance, reliability, and life expectancy of the removable circuit device, and may also cause its failure.

To overcome such issues related to waste heat in the removable circuit device, a heat spreader, i.e., a thermal transfer device that increases an area of thermal contact and/or distributes heat more evenly, may be thermally connected to the plurality of electronic components to transfer the waste heat from the removable circuit device. Further, cooling air may be blown over the heat sink to remove the waste heat from the heat spreader. However, when the removable circuit device is connected to the host circuit device, the heat spreader may not receive adequate supply of cooling air to remove the waste heat from the heat spreader, thereby degrading the performance of the removable circuit device.

Hence, the host circuit device may include a cold plate to remove the waste heat from the heat spreader. For example, the cold plate may establish a thermal contact (or form a thermal interface) with the heat spreader when the removable circuit device is removably connected to the host circuit device to transfer the waste heat from the heat spreader to the cold plate, and thereby remove the waste heat from the heat spreader. However, it may be difficult to maintain the thermal contact between the cold plate and the heat spreader (e.g., between two interfacing surfaces), as the interfacing surfaces may not be flat and/or smooth. Also, the accumulation of debris and/or surface imperfections (e.g., scratches, dents, or the like) in either of the interfacing surfaces may compromise the heat transfer between the interfacing surfaces.

To address the aforementioned issues with the interfacing surfaces, the host circuit device may further include a thermal interface material, such as thermally conductive grease. The thermally conductive grease may be disposed on one of the interfacing surfaces such that when the removable circuit device is removably connected to the host circuit device, the thermally conductive grease is interposed between the interfacing surfaces. Hence, the thermally conductive grease may maintain an optimal thermal contact between the cold plate and the heat spreader irrespective of variations in the interfacing surfaces. However, repetitive connection and disconnection between the removable circuit device and the host circuit device may cause the thermally conductive grease to be scraped off from one of the interfacing surfaces. Further, the thermally conductive grease may have to be replaced after every service event.

In order to overcome the aforementioned issues with thermally conductive grease, the host circuit device may include a thermal interface material, such as thermally conductive multiple spring fingers. For example, one end of each of the multiple spring fingers may be coupled to the cold plate and other end of each of the multiple spring fingers may contact the heat spreader, when the removable circuit device is removably connected to the host circuit device. Each of the multiple spring fingers may exert a contact force (e.g., spring force) to establish the thermal contact with the heat spreader irrespective of variations in the surface of the heat spreader. However, the contact force exerted by each of the multiple spring fingers may oppose an insertion force applied by a user to connect the removable circuit device to the host circuit device or a removal force applied by a user to disconnect the removable circuit device from the host circuit device. In other words, each of the multiple spring fingers may have to exert an optimal contact force to establish a thermally conductive pathway between the heat spreader and the cold plate, while at the same time, allow the removable circuit device to be easily connected and disconnected by a user from the host circuit device. Moreover, a user may be required to apply repetitive force (e.g., multiple insertion forces and removal forces) to overcome the contact force between the removable circuit device and the host circuit device during repetitive connection and disconnection between the devices. Such repetitive application of force by the user could cause repetitive force related injuries to the user unless an optimal contact force between the spring fingers and the heat spreader is maintained which is within acceptable safety limits. However, regulating the multiple spring fingers to maintain such an optimal contact force may be extremely difficult.

A technical solution to the aforementioned problems may include providing a cooling assembly in a host circuit device of a circuit assembly to manage waste heat produced by a removable circuit device. In one or more examples, the cooling assembly includes a cooling component and a thermal gap pad including an elastomer component and a plurality of beams. The elastomer component is an elastic and thermally non-conductive component and each of the plurality of beams is a non-elastic and thermally conductive component. In some examples, the plurality of beams is embedded in the elastomer component such that a first end portion of each beam protrudes beyond a top surface of the elastomer component, a second end portion of each beam protrudes beyond a bottom surface of the elastomer component, and a body portion extending between the first and second end portions is retained in the elastomer component. The cooling component is rigidly connected to the cooling assembly and the elastomer component is movably connected to the cooling component. The thermal gap pad is disposed in the cooling assembly such that the first end portion of each of one or more beams of the plurality of beams is disposed in a first thermal contact with the cooling component and the second end portion of each of the one or more beams is disposed in a second thermal contact with a heat sink of the removable circuit device.

In some examples, when the removable circuit device is removably connected to the host circuit device: i) the second end portion of each of the one or more beams rotates to contact the heat sink and displace the elastomer component upwards towards the cooling component, ii) the elastomer component moves each of the one or more beams upwards towards the cooling component, and iii) the first end portion of each of the one or more beams rotates to contact the cooling component and establish a thermally conductive pathway between the cooling component and the heat sink via each of the one or more beams. Thus, the second end portion of each of the one or more beams embedded in the elastomer component may establish a multi-point contact with the heat sink and the first end portion of each of the one or more beams embedded in the elastomer component may create another multi-point contact with the cooling component.

The elastomer component may exert a contact force to establish and maintain the thermal contact between the heat sink and the cooling component via the one or more beams. In some examples, the contact force exerted by the elastomer component may be adjusted by changing the type of material used in the elastomer component. For example, a stiffer material used in the elastomer component or a thinner elastomer component may result in higher contact force. Further, the contact force exerted by the elastomer component may be tuned by changing physical properties or physical dimensions of the elastomer component. Thus, the elastomer component's ability to get displaced (e.g., bend or deform) upon connection of the removable circuit device may cause the one or more beams to change their physical geometry without impacting the contact force. Accordingly, a cross-sectional area of the one or more beams may be maximized to establish the thermally conductive pathway between the cooling component and the heat sink without the tradeoff of significantly higher contact force that the multiple spring fingers may require to establish the thermally conductive pathway.

Further, the elastomer component may exert a multiplicity (array) of contact forces via the plurality of beams to create a substantially low insertion force for connecting the removable circuit device to the host circuit device and for disconnecting the removable circuit device from the host circuit device. At the same time, the elastomer component may provide the multipoint contact conduction cooling of the removable circuit device through the one or more beams for an effective thermal management of the removable circuit device. In some examples, the multiplicity of contact forces exerted by the elastomer component via the one or more beams is within acceptable safety limits to avoid repetitive force related injuries. For example, the contact force exerted by the elastomer component via each beam may be in a range from about 0.01 pound-force to 3.0 pound-force. In some examples, the elastomer component may displace upwards towards the cooling component in a range from about 0.3 millimeter to 1.5 millimeter to allow easy plugging-in of the removable circuit device into the host circuit device. The elastomer component can maintain the multi-point contact with the heat sink via the plurality of beams, even though the cooling component and/or the heat sink has a non-smooth surface, a non-flat surface, surface imperfections, or debris, because the elastomer component may independently move each beam to establish the direct thermal interface with the cooling component and the heat sink. Accordingly, the elastomer component and the embedded plurality of beams provide multipoint conduction cooling to overcome the aforementioned problems related to multiple spring fingers.

In one or more examples of the present disclosure, a cooling assembly for thermal management of a removable circuit device, and a host circuit device having such cooling assembly are disclosed. The cooling assembly includes a cooling component and a thermal gap pad. The thermal gap pad includes an elastomer component and a plurality of beams embedded in the elastomer component. The elastomer material is movably connected to the cooling component. Each of the plurality of beams includes a first end portion, a second end portion, and a body portion extended between the first and second end portions. The first end portion of each of the one or more beams of the plurality of beams is disposed in a first thermal contact with the cooling component and the second end portion of each of the one or more beams is disposed in a second thermal contact with a heat sink.

Figure 1A:
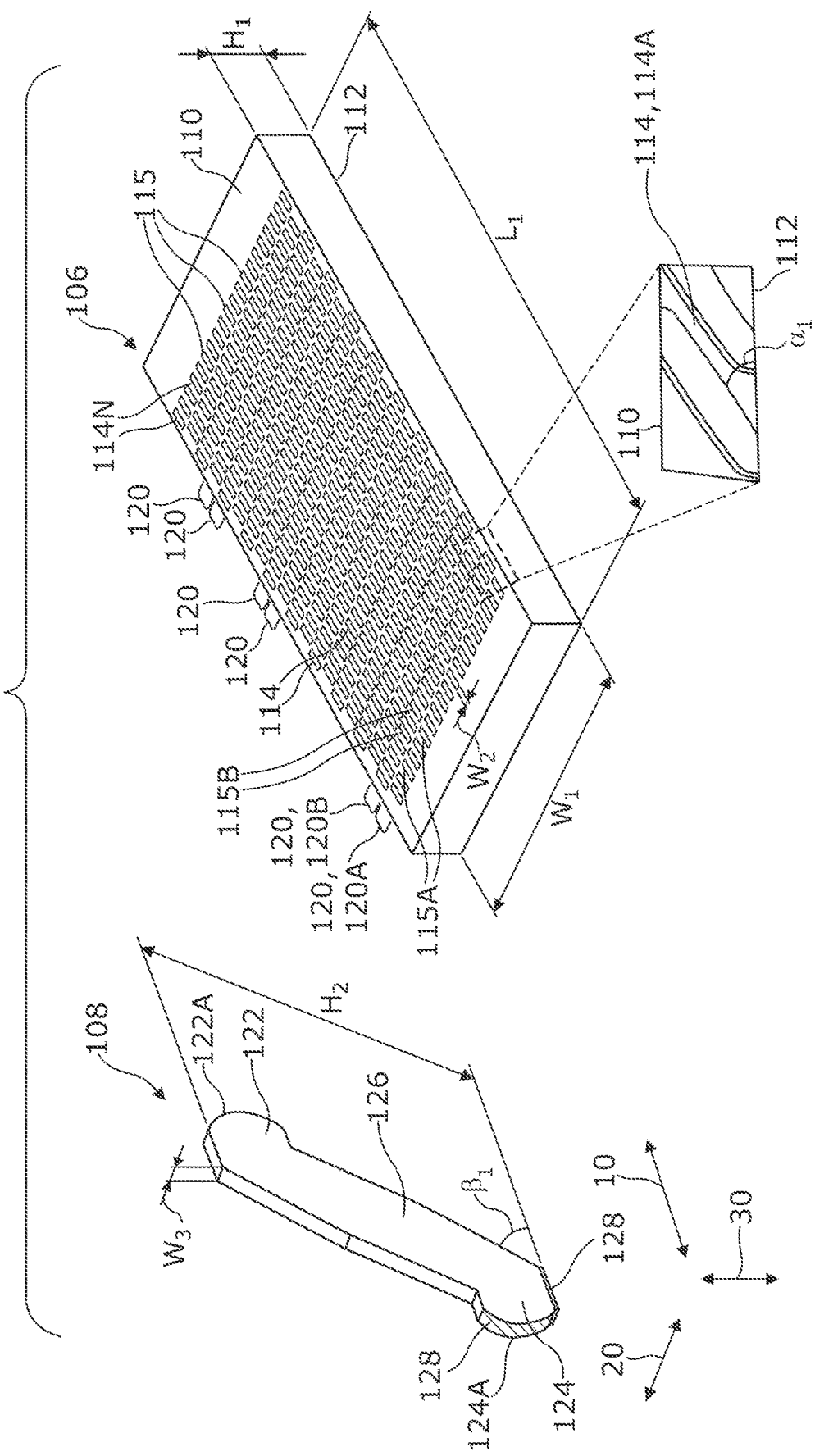
FIG. 1A illustrates an exploded perspective view of a thermal gap pad according to an example implementation of the present disclosure.
Figure 1B:
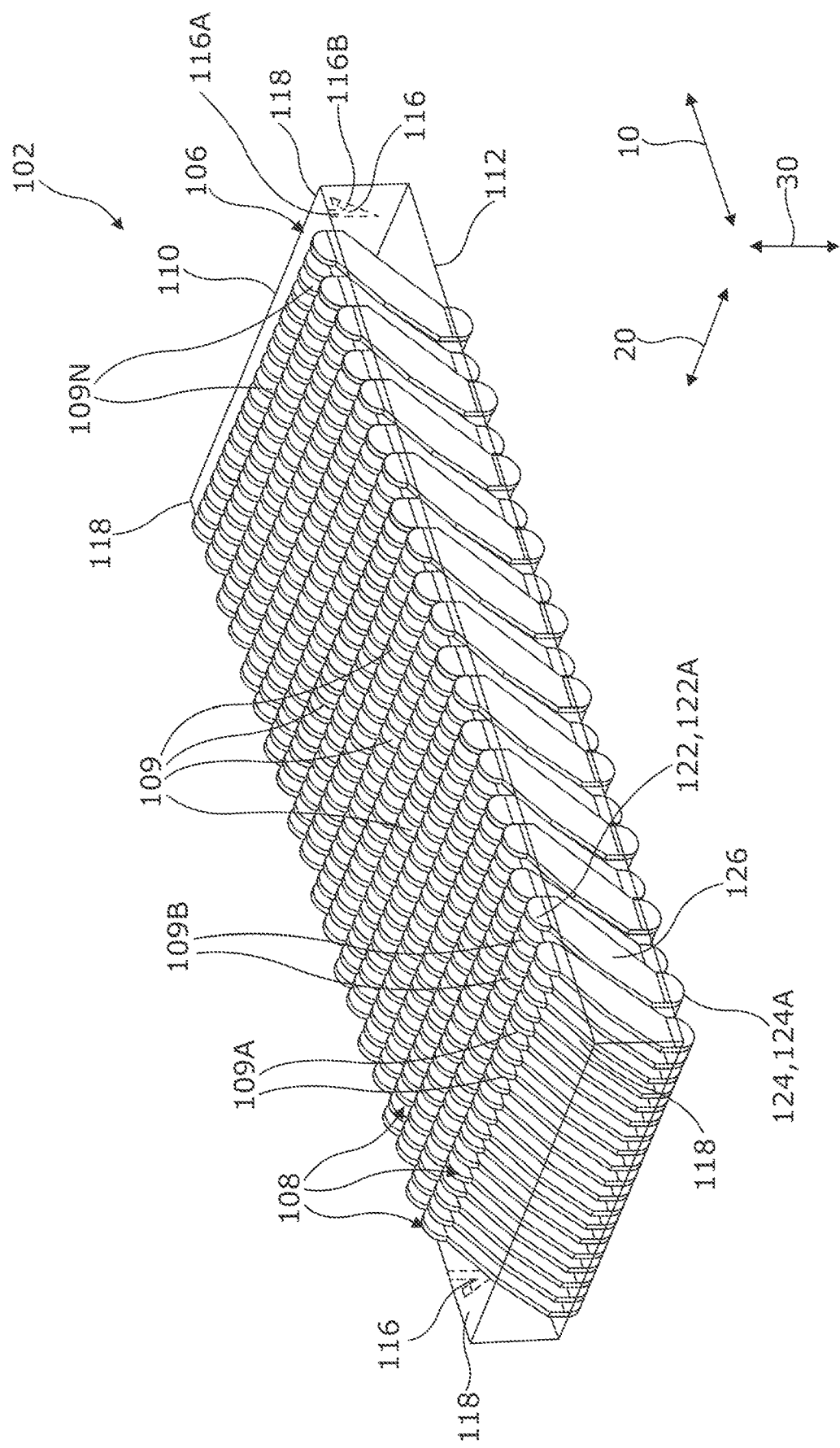
FIG. 1B illustrates an assembled perspective view of the thermal gap pad of FIG. 1A according to an example implementation of the present disclosure.
Figure 3:
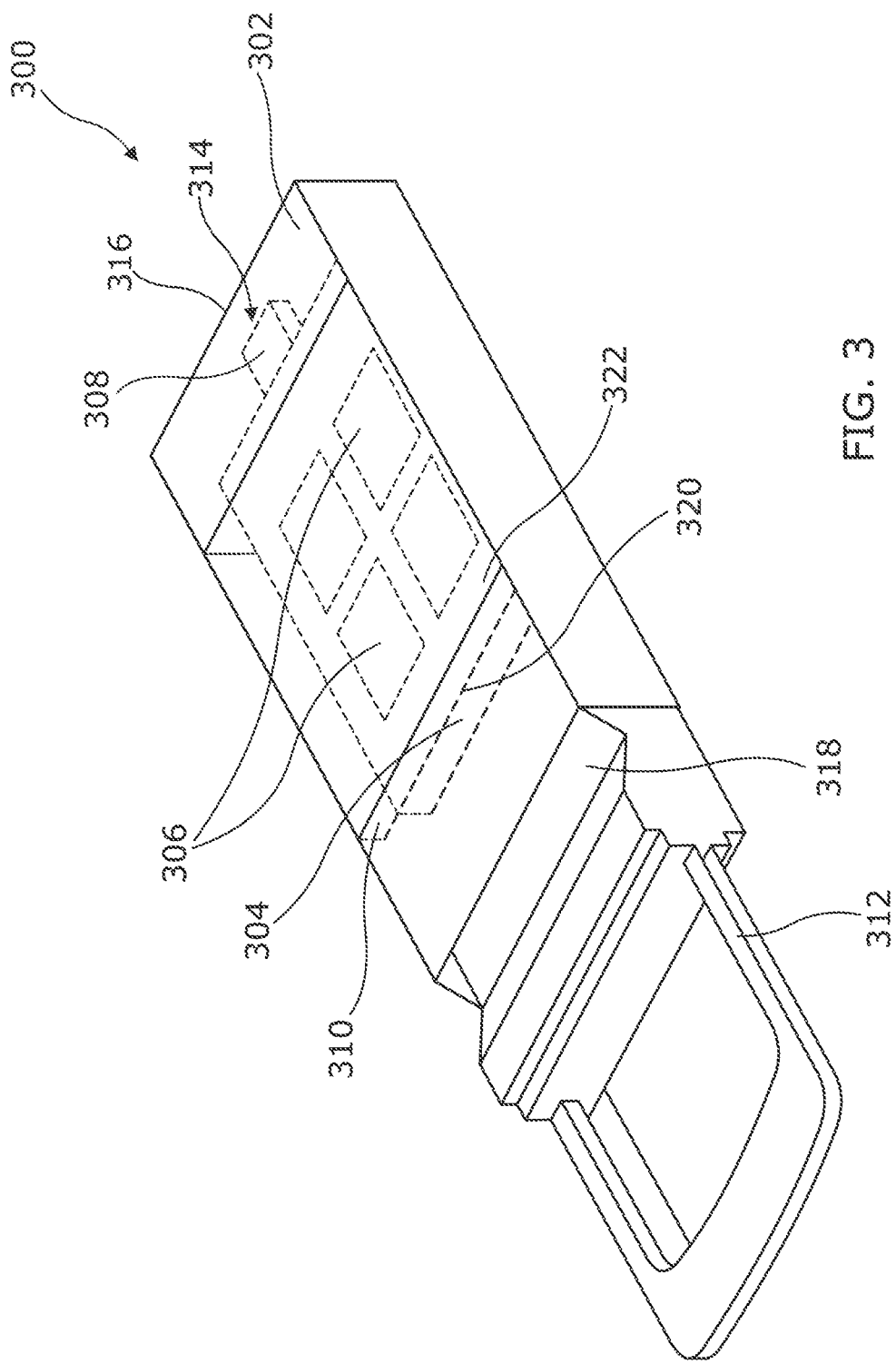
FIG. 3 illustrates a perspective view of a removable circuit device having a circuit board, a plurality of electronic components, and a heat sink according to an example implementation of the present disclosure.

FIG. 1A depicts a perspective exploded view of a thermal gap pad 102 of a cooling assembly 100 (as shown in FIG. 1E). FIG. 1B depicts an assembled perspective view of the thermal gap pad 102. In the description hereinafter, the Figures, FIGS. 1A-1B are described concurrently for ease of illustration. The thermal gap pad 102 includes an elastomer component 106 and a plurality of beams 108 (as shown in FIG. 1B). The thermal gap pad 102 may be used to establish a thermally conductive pathway between a cooling component 104 and a heat sink 310 (as shown in FIG. 3 and FIG. 4B) for dissipation of waste heat from a plurality of electronic components 306 of the removable circuit device 300 (as shown in FIG. 3 and FIG. 4B).

In some examples, the elastomer component 106 is a rectangular-shaped elastic and thermally non-conductive component having a top surface 110 and a bottom surface 112. The elastomer component 106 may be made of one of a silicone, a rubber, a foam, or a thermoplastic polyurethane material. The elastomer component 106 may displace (e.g., bend or deform) upon application of force (or load) on one of its surfaces and regain its original shape upon withdrawal of force. Additionally, the elastomer component 106 may not conduct (or transfer) the waste heat from the heat sink 310 to the cooling component 104, even when the cooling component 104 and the heat sink 310 are disposed in thermal contact with each other via the elastomer component 106. In some examples, the elastomer component 106 has a length "$L_1$" that extends along a longitudinal direction 10, a width "$W_1$" that extends along a lateral direction 20, and a height "$H_1$" that extends along a vertical direction 30. Further, the elastomer component 106 has a plurality of through-holes 114. Each of the plurality of through-holes 114 extends between the top surface 110 and the bottom surface 112 of the elastomer component 106. Further, each of the plurality of through-holes 114 are disposed spaced apart from each other along the longitudinal direction 30 and the lateral direction 20. For example, the plurality of through-holes 114 are arranged along multiple columns 120 along the length "$L_1$" to form an array of through-holes 115. The array of through-holes 115 may include multiple set of through-holes, e.g., 115A, 115B . . . 115N, which are arranged along multiple columns 120. In some examples, a first set of through-holes 115A among the array of through-holes 115 are arranged along a first column 120A. Similarly, a second set of through-holes 115B among the array of through-holes 115 are arranged along a second column 120B among the plurality of columns 120. In such examples, each hole in the first set of through-holes 115A is positioned between two mutually adjacent through-holes in the second set of through-holes 115B, and the first set of through-holes 115A have an offset or staggered arrangement with respect to the second set of through-holes 115B. In some examples, each of the plurality of through-holes 114 is an angled hole having a rectangular-shaped cross sectional profile. Each hole of the plurality of through-holes 114 has a first width "$W_2$". In one or more examples, each through-hole among the plurality of through-holes 114 is inclined at a first angle "$\alpha_1$" relative to the bottom surface 112. In some examples, the first angle "$\alpha_1$" may be in a range from about 30 degrees to about 60 degrees. The elastomer component 106 further includes a plurality of retention holes 116 (as clearly shown on FIG. 1B). In some examples, each of the plurality of retention holes 116 has a fish-hook profile. The fish-hook profile of each retention hole includes a linearly extended through-hole portion 116A and a curved hole portion 116B connected to the linearly extended through-hole portion 116A. The plurality of retention holes 116 are formed at the top surface 110 and positioned adjacent to peripheral corners 118 of the elastomer component 106.

In the example of FIG. 1A, only one beam among the plurality of beams 108 is shown for ease of illustration. In one or more examples, each of the plurality of beams 108 has a slanting S-shaped profile, for example. In some examples, each of the plurality of beams 108 is made of one of a copper, an aluminum, an alloy material, or the like. Each of the plurality of beams 108 is a non-elastic and thermally conductive component. As used herein, "non-elastic component" may refer to a rigid component, which does not deform or bend upon application of force (or load). For example, the non-elastic component may only move (or rotate) upon application of force and may not deform or bend. Additionally, each of the plurality of beams 108 may conduct (or transfer) the waste heat from the heat sink 310 to the cooling component 104, when the cooling component 104 and the heat sink 310 are disposed in thermal contact with each other via a corresponding beam 108. In some examples, each of the plurality of beams 108 has a first end portion 122, a second end portion 124, and a body portion 126 extended between the first end portion 122 and the second end portion 124. In some examples, the first end portion 122 may be referred to as a top end portion and the second end portion 124 may be referred to as a bottom end portion. In other words, the first end portion 122 and the second end portion 124 are opposite end portions of the corresponding beam 108. In some examples, the first end portion 122 has a first curved surface 122A and the second end portion 124 has a second curved surface 124A that allows the first end portion 122 and the second end portion 124 of the corresponding beam 108 to rotate upon contacting a corresponding interfacing surface. The second end portion 124 of each of the plurality of beams 108 further includes an electrically insulating layer 128, thereby preventing any electrical short-circuit. For example, the second end portion 124 may be coated with the electrically insulating layer 128. In one or more examples, the electrically insulating layer 128 may be a thermally conductive layer. In some examples, the electrically insulating layer 128 may be made of one of a ceramic or a mica material. In some examples, each beam 108 has a second height "$H_2$", which is substantially greater than the first height "$H_1$" of the elastomer component 106.

For example, the second height "$H_2$" may be in a range from about 1.3 to 1.6 times greater than the first height "$H_1$". Further, each beam 108 has a second width "$W_3$", which is substantially equal to that of the first width "$W_2$" of each through-hole 114 of the elastomer component 106. In some examples, the body portion 126 of each beam 108 is an angled body portion. In one or more examples, the body portion 126 of each beam 108 is inclined at a second angle "$\beta_1$" relative to the second end portion 124. In some examples, the second angle "$\beta_1$" may be in a range from about 30 degrees to about 60 degrees.

Referring to FIG. 1B, the elastomer component 106 is shown to be transparent for ease of illustration and such an illustration should not be construed as a limitation of the present disclosure. The plurality of beams 108 are embedded in the elastomer component 106. For example, each beam 108 is disposed in a corresponding through-hole of the plurality of through-holes 114 to embed the corresponding beam 108 to the elastomer component 106. Since the second width "$W_3$" of each beam 108 is substantially equal to the first width "$W_2$" of each through-hole 114, each beam 108 press-fits inside the corresponding through-hole 114 to embed in the elastomer component 106. In some examples, the first end portion 122 of each beam 108 protrudes beyond the top surface 110 of the elastomer component 106, the second end portion 124 of each beam 108 protrudes beyond the bottom surface 112 of the elastomer component 106, and the body portion 126 of each beam 108 is positioned within the elastomer component 106 of the elastomer component 106. Since the second height "$H_2$" of each beam 108 is substantially greater than the first height "$H_1$" of the elastomer component 106, the first end portion 122 and the second end portion 124 protrude beyond the elastomer component 106. In one or more examples, each of the plurality of beams 108 are discrete beams. As used herein, "discrete beams" may refer to separate beams, which are not directly connected or coupled to each other. The discrete beams among the plurality of beams 108 are arranged adjacent to each other along the lateral direction 20 and the longitudinal direction 10 of the elastomer component 106 to form an array of beams 109. The array of beams 109 may include multiple set of beams, e.g., 109A, 109B, . . . 109N, which are arranged along the multiple columns 120 (as shown in FIG. 1B). In some examples, a first set of beams 109A among the array of beams 109 are arranged along the first column 120A. Similarly, a second set of beams 109B among the array of beams 109 are arranged along the second column 120B.

In one or more examples, the second end portion 124 of each of the plurality of beams 108 may absorb the waste heat from the heat sink 310, the body portion 126 may conduct the absorbed waste heat to the first end portion 122 of the corresponding beam 108, and the first end portion 122 may transfer the waste heat to the cooling component 104.

FIG. 1C depicts an exploded perspective view of a cooling component 104 of the cooling assembly 100. FIG. 1D depicts an assembled perspective view of the cooling component 104 of FIG. 1C. In the description hereinafter, the Figures, FIGS. 1C-1D are described concurrently for ease of illustration. In one or more examples, the cooling component 104 is a thermally conductive component made of one of a copper, an aluminum, or an alloy. The cooling component 104 may function as a cold plate. The cooling component 104 may include a body 130 and a housing 132. The body 130 may include heat transfer features 134, for example, fins or internal tubes. Further, the housing 132 may be attached atop the body 130 in a fluid tight manner or may be monolithic to the body 130 (e.g., the body 130 and the housing 132 are formed as a single unit). The housing 132 may include a coolant inlet 136 and a coolant outlet 138. The body 130 may absorb the waste heat from the first end portion 122 of one or more beams among the plurality of beams 108. The coolant may enter from the coolant inlet 136, absorb heat from the body 130 via the heat transfer features 134, and may exit from the coolant outlet 138. The cooling assembly 100 may further include a thermally conductive grease 140. In some examples, the thermally conductive grease 140 may be disposed on an outer surface of the body 130. The waste heat may be conducted from the first end portion 122 of one or more beams 108 to the body 130 of the cooling component 104 via the thermally conductive grease 140. The thermally conductive grease 140 may be attached to the cooling component 104 via a thermally conductive epoxy layer.

Figure 2:
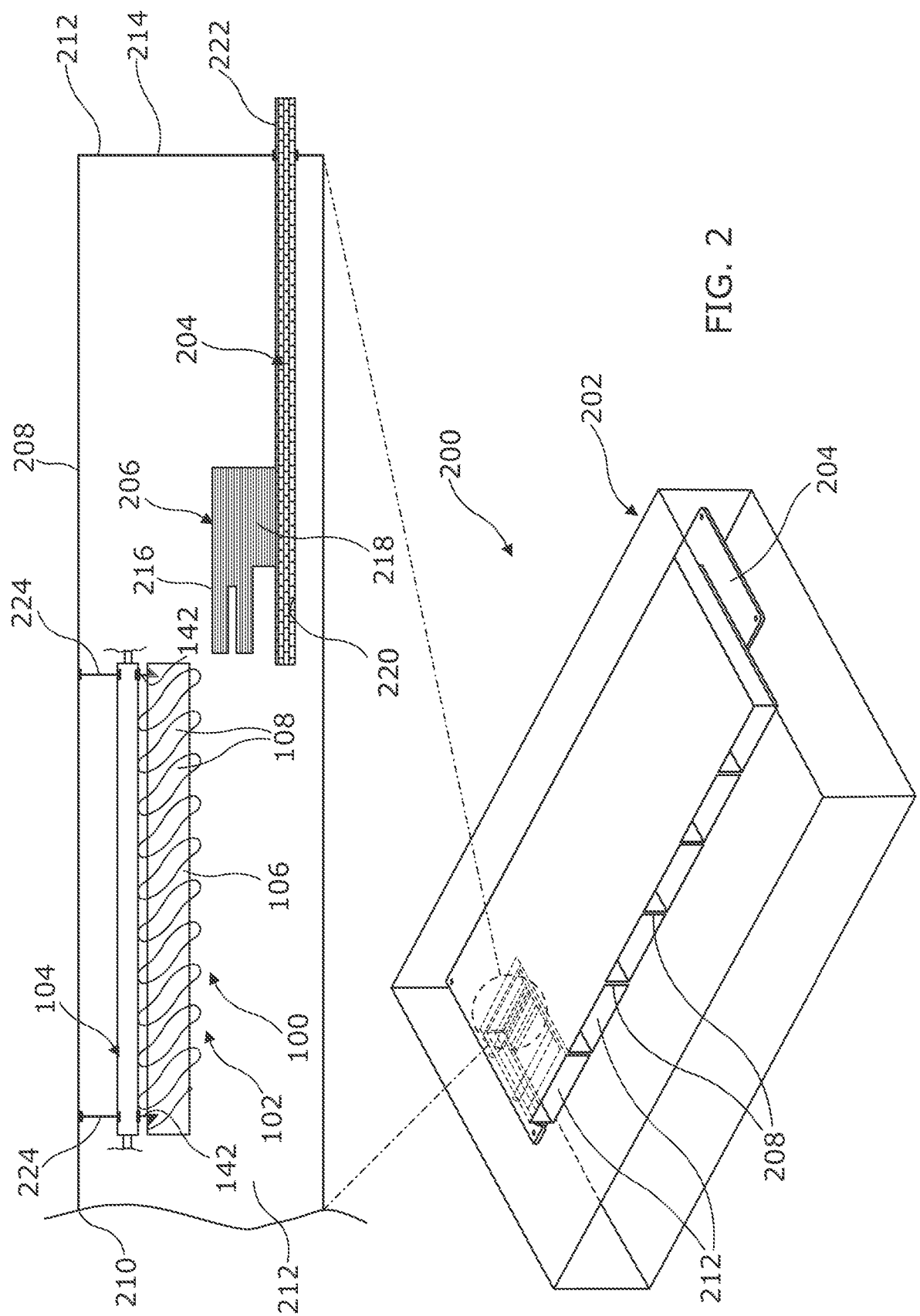
FIG. 2 illustrates a schematic diagram of a host circuit device having a host circuit board and a cooling assembly of FIG. 1E according to an example implementation of the present disclosure.

FIG. 1E depicts a block diagram of the cooling assembly 100 of a host circuit device 200, having the thermal gap pad 102 of FIGS. 1A-1B and the cooling component 104 of FIGS. 1C-1D. In one or more examples, the cooling assembly 100 is used for thermal management of a removable circuit device 300 (as shown in FIG. 3). For example, the cooling assembly 100 may be disposed within a housing of the host circuit device 200 (as shown in FIG. 2) for thermal management of the removable circuit device 300. Accordingly, when the removable circuit device 300 is removably connected to the host circuit device 200, the cooling assembly 100 may establish a thermally conductive pathway between the heat sink 310 of the removable circuit device 300 and the cooling component 104 for conduction of waste heat from the plurality of electronic components 306 to the cooling component 104.

In some examples, the cooling component 104 may be rigidly coupled to a receptacle casing 208 of a host circuit device 200 (as shown in FIG. 2). As discussed in FIGS. 1C-1D, the cooling component 104 includes the body 130 and the housing 132. The body 130 may include heat transfer features 134 (a shown in FIG. 1D) and the housing 132 may be attached atop the body 130. The housing 132 may include the coolant inlet 136 and the coolant outlet 138. The coolant inlet 136 may be connected to an inlet manifold of a coolant distribution unit (CDU, not shown) and the coolant outlet 138 may be connected to an outlet manifold of the CDU.

As discussed in FIGS. 1A-1B, the thermal gap pad 102 includes the elastomer component 106 and the plurality of beams 108. In one or more examples, the plurality of beams 108 are embedded in the elastomer component 106. For example, the elastomer component 106 includes the plurality of through-holes 114. In such examples, the plurality of beams 108 are disposed in the plurality of through-holes 114 to be embedded in the elastomer component 106. The first end portion 122 of each beam 108 protrudes beyond the top surface 110 of the elastomer component 106, the second end portion 124 protrudes beyond the bottom surface 112 of the elastomer component 106, and the angled body portion 126 is disposed within the elastomer component 106. Further, the elastomer component 106 having such plurality of embedded beams 108 is movably connected to the cooling component 104. For example, the cooling assembly 100 includes a plurality of hooks 142 having a first end 142A and a second end 142B. The first end 142A may have a flat profile and the second end 142B may have a fish hook profile. In particular, the second end 142B has a linearly extended portion $142B_1$ and a curved portion $142B_2$ connected to the linearly extended portion $142B_1$. In such examples, the first end 142A is rigidly connected to the cooling component 104 and the second end 142B is disposed in a corresponding retention hole of the plurality of retention holes 116 formed in the elastomer component 106. For example, the linearly extended portion $142B_1$ of each hook 142 may be disposed in the linearly extended through-hole portion 116A and the curved portion $142B_2$ of each hook 142 may be disposed in the curved hole portion 116B of a corresponding retention hole 116. The linearly extended through-hole portion 116A may allow the elastomer component 106 to reciprocate relative to the linearly extended portion $142B_1$, and the curved portion $142B_2$ may engage with the curved hole portion 116B (as shown in FIG. 1B) to movably connect the elastomer component 106 to the cooling component 104. Therefore, such a connection of the elastomer component 106 to the cooling component 104 via the plurality of hooks 142 may allow the elastomer component 106 to have the movable connection relative to the cooling component 104. In some examples, when the elastomer component 106 is movably connected to the cooling component 104, the first end portion 122 of one or more beams of the plurality of beams 108 are disposed in a first thermal contact 144 with the cooling component 104 and the second end portion 124 of the one or more beams 108 are disposable in a second thermal contact 146 with the heat sink 310 of the removable circuit device 300. In some examples, the first thermal contact 144 is formed between wet contact surfaces and the second thermal contact 146 is formed between dry contact surfaces. As used herein, "dry contact surfaces" may refer to thermally coupled surfaces of two objects, which does not contain any intervening elements there between to enable transfer of waste heat from one object to other object. As used herein, "wet contact surfaces" may refer to thermally coupled surfaces of two objects, which contains an intervening object such as a thermally conductive grease there between to enable transfer of waste heat from one object to the other object via the intervening object. In some examples, when the one or more beams 108 form the first and second thermal contacts with the cooling component 104 and the heat sink 310 respectively, a thermally conductive pathway 148 may be established between the heat sink 310 and the cooling component 104 via each of the one or more beams 108 to conduct the waste heat from the plurality of electronic components 306 to the cooling component 104.

FIG. 2 depicts a perspective view of a host circuit device 200. In some examples, the host circuit device 200 is a networking switch, for example an Ethernet switch. In some other examples, the host circuit device 200 may be a universal serial bus (USB) hub, or the like without deviating from the scope of the present disclosure. The host circuit device 200 may include a housing 202, a host circuit board 204, a plurality of sockets 206, and a plurality of cooling assemblies 100. It may be noted herein that the example of FIG. 2 shows only one socket 206 and one cooling assembly 100 for ease of illustration and such an illustration should not be construed as a limitation of the present disclosure. The host circuit device 200 may be an integral part of the circuit assembly 400 (as shown in FIG. 4) or may be a modular component, which may be attached/coupled to the circuit assembly 400 of an electronic device such as a server system, a storage system, a networking system, or the like.

The housing 202 may host the host circuit board 204 and include a plurality of receptacle casings 208. In the illustrated example of FIG. 1A, the host circuit device 204 has six receptacle casings 208, which are disposed adjacent to each other. Further, the plurality of receptacle casings 208 are located at least partially over the host circuit board 204.

Each receptacle casing 208 includes a front end 210 having an opening 212 and a distal end 214.

The host circuit board 204 is disposed within the housing 202. In some examples, the host circuit board 204 may include a front end section 220 and a rear end section 222. In such examples, the rear end section 222 may be connected to a printed circuit board (e.g., mother board, not shown) of the circuit assembly 400 via a suitable interconnect mechanism, such as soldering.

The plurality of sockets 206 are disposed spaced apart from each other and mounted on the front end section 220 of the host circuit board 204. For example, each socket 206 is disposed proximate to the distal end 214 of the receptacle casing 208 such that an open end 216 of the corresponding socket 206 is disposed facing the opening 212 and the closed end 218 of the corresponding socket 206 is disposed on the front end section 220 of the host circuit board 204. In some examples, each socket 206 may be a small form-factor pluggable (SFP) socket or an SFP port. Further, each of the plurality of sockets 206 facing the opening 212 may receive the removable circuit device 300 and establish a communication between the removable circuit device 300 and the circuit assembly 400 via the host circuit device 200.

In some examples, each cooling assembly 100 is disposed within a corresponding receptacle casing 208, disposed adjacent to the host circuit board 204, and located proximate to the front end 210 of the corresponding receptacle casing 208. Further, each cooling assembly 100 is coupled to the corresponding receptacle casing 208. For example, the cooling assembly 100 includes the cooling component 104, which is rigidly connected to the corresponding receptacle casing 208 via a plurality of fasteners 224. Each cooling assembly 100 further includes the thermal gap pad 102. The thermal gap pad 102 includes a plurality of beams 108 and an elastomer component 106. In one or more examples, the plurality of beams 108 are embedded in the elastomer component 106. Further, the elastomer component 106 having the plurality of embedded beams 108 is movably connected to the cooling component 104 via a plurality of hooks 142. In some examples, when the elastomer component 106 is movably connected to the cooling component 104, the first end portion 122 of one or more beams of the plurality of beams 108 are disposed in the first thermal contact 144 (as shown in FIG. 1E) with the cooling component 104 and the second end portion 124 of the one or more beams 108 are disposable in the second thermal contact 146 (as shown in FIG. 1E) with the heat sink 310 of the removable circuit device 300. In some examples, when the one or more beams 108 establishes the first and second thermal contacts with the cooling component 104 and the heat sink 310 respectively, a thermally conductive pathway 148 (as shown in FIG. 1E) may be established between the heat sink 310 and the cooling component 104 via each of the one or more beams 108 to conduct the waste heat from the plurality of electronic components 306 to the cooling component 104.

FIG. 3 depicts a perspective view of a removable circuit device 300. In some examples, the removable circuit device 300 is a pluggable electronic device, for example, a data communication device having a transceiver. In certain examples, the transceiver may be a small form-factor pluggable (SFP) transceiver coupled to an active optical cable (AOC, not shown) or a Quad small form-factor pluggable (QSFP) transceiver coupled to the AOC, or the like. Other types of the removable circuit device 300, such as the storage drive, for example, NVMe storage drive, or the like may be envisioned without deviating from the scope of the present disclosure.

The removable circuit device 300 includes a casing 302, a circuit board 304, a plurality of electronic components 306, a plug 308, a heat sink 310, and a handle 312. The casing 302 may shield the circuit board 304 and the plurality of electronic components 306 from electromagnetic interference (EMI) and improve the reliability of the removable circuit device 300. The casing 302 may have an opening 314 at a distal end 316 and the handle 312 connected at the front end 318.

In some examples, the circuit board 304 may include a semiconductor component. The circuit board 304 is disposed on a base on the casing 302. The plurality of electronic components 306 is disposed on the circuit board 304. In some examples, the plurality of electronic components 306 may include a processor, capacitors, resistors, or the like. The plug 308 is connected to a distal end (not labeled) of the circuit board 304 such that the plug 308 is disposed facing the opening 314.

In some examples, the heat sink 310 is located in the casing 302 and thermally coupled to the plurality of electronic components 306. For example, the heat sink 310 is disposed on the plurality of electronic components 306 such that an inner surface 320 of the heat sink 310 is in thermal contact with the plurality of electronic components 306 and an outer surface 322 of the heat sink 310 is protruded beyond the removable circuit device 300. The inner surface 320 of the heat sink 310 may absorb the waste heat from the plurality of electronic components 306 and transfer the absorbed waste heat to the outer surface 322. In one or more examples, the heat sink 310 includes a thermally conductive material, for example, the copper material, the aluminum material, or the like. The handle 312 may be used to removably couple the removable circuit device 300 to the host circuit device 200.

FIG. 4A depicts a perspective view of a portion of a circuit assembly 400 of an electronic device (not shown). FIG. 4B depicts a block diagram of a portion of the circuit assembly 400 of FIG. 4A having a cooling component 104, a heat sink 310, a circuit board 304, and a host circuit board 204. In the description hereinafter, the Figures, FIGS. 4A-4B are described concurrently for ease of illustration. The circuit assembly 400 may be disposed within an enclosure 402 of the electronic device, such as a computer (a server or a storage device), a networking device (a wireless access point or a router), or the like. The circuit assembly 400 may include a host circuit device 200, a printed circuit board (e.g., a mother board, not shown), and a removable circuit device 300. In some examples, the host circuit device 200 and the printed circuit board may be disposed within the enclosure 402. Further, the printed circuit board may be communicatively coupled to the host circuit device 200, and the removable circuit device 300 may be removably connected to the host circuit device 200.

As discussed hereinabove in the example of FIG. 2, the host circuit device 200 includes a host circuit board 204, at least one socket 206, and a cooling assembly 100. The host circuit board 204 is disposed in a housing 202 (as shown in FIG. 2) of the host circuit device 200. The socket 206 is disposed within a receptacle casing 208 (as shown in FIG. 2) of the housing 202, and mounted on the host circuit board 204. The cooling assembly 100 is disposed within and coupled to the receptacle casing 208. The cooling assembly 100 includes a cooling component 104 rigidly connected to the receptacle casing 208, and a thermal gap pad 102 movably connected to the cooling component 104. The thermal gap pad 102 includes an elastomer component 106 and a plurality of beams 108 embedded in the elastomer component 106.

As discussed hereinabove in the example of FIG. 3, the removable circuit device 300 includes a circuit board 304, a plurality of electronic components 306, a plug 308, and a heat sink 310. In the example implementation of the removable circuit device 300, for illustration purposes, each of the plurality of electronic components 306 is shown as being a processor.

The removable circuit device 300 may be removably connected to the host circuit device 200 via the opening 212 formed in the host circuit device 200. In one or more examples, the removable circuit device 300 is inserted (or plugged) inside the receptacle casing 208 via the opening 212 of the host circuit device 200 along the longitudinal direction 10, to removably connect the removable circuit device 300 to the host circuit device 200. In some examples, when the removable circuit device 300 is plugged (inserted) to the host circuit device 200, the circuit board 304 is communicatively coupled to the host circuit board 204. For example, the plug 308 of the circuit board 304 is inserted into socket 206 of the host circuit board 204 to communicatively couple the circuit board 304 to the host circuit board 204. Further, when the removable circuit device 300 is plugged to the host circuit device 200, the first end portion 122 of each of one or more beams of the plurality of beams 108 is disposed in a first thermal contact 144 with the cooling component 104. In one or more examples, the first thermal contact 144 is formed between wet contact surfaces due to presence of the thermally conductive grease 140 between the first end portion 122 of each of the one or more beams 108 and the cooling component 104. Further, the second end portion 124 of each of the one or more beams 108 is disposed in a second thermal contact 146 with the heat sink 310. In one or more examples, the second thermal contact 146 is formed between the dry contact surfaces due to direct thermal contact between the second end portion 124 of each of the one or more beams 108 and the heat sink 310. In one or more examples, when the first thermal contact 144 and the second thermal contact 146 are formed, a thermally conductive pathway 148 is established between the cooling component 104 and the heat sink 310 via each of the one or more beams 108. For example, the thermally conductive pathway 148 is established between the heat sink 310 and the cooling component 104 via the first end portion 122, the body portion 126 (as shown in FIG. 1A), and the second end portion 124 of each of the one or more beams 108. In one or more examples, the waste heat is conducted from the removable circuit device 300 to the host circuit device 200 via the thermally conductive pathway.

In some examples, each beam is aligned at a first position 408 before the removable circuit device 300 is removably connected to the host circuit device 200. When the removable circuit device 300 is connected to the host circuit device 200, a contact force is exerted by the elastomer component 106 on the heat sink 310 via the plurality of beams 108. In such examples, the second end portion 124 of each of the one or more beams 108 rotates along a counterclockwise direction 404 to contact the heat sink 310 and displace the elastomer component 106 upwards 406 towards the cooling component 104. Accordingly, each of the one or more beams 108 move from the first position 408 to a second position 410 and displace the elastomer component 106 upwards towards the cooling component 104. In one or more examples, the elastomer component 106 bends or deforms due to its displacement by the first end portion 122 of each of the one or more beams 108.

Further, when the elastomer component 106 is displaced upwards, it simultaneously moves each of the one or more beams 108 upwards towards the cooling component 104. Since the body portion 126 of each of the one or more beams 108 is embedded in the elastomer component 106, the displacement of the elastomer component 106 may result in displacement of the body portion 126 of each of one or more beams 108 via the elastomer component 106.

Later, the displacement of the body portion 126 of each of the one or more beams 108 may cause the first end portion 122 of each of the one or more beams 108 to rotate along a clockwise direction 412 to contact the cooling component 104. Accordingly, the thermally conductive pathway 148 (as shown in FIG. 1E) is established between the cooling component 104 and the heat sink 310 via each of the one or more beams 108. In some examples, the first set of beams 109A and the last set of beams 109N among the array of beams 109 (only one beam in each set is shown for ease of illustration) may be rotated to an extent by the elastomer component 106 that they may not establish thermal contact with at least one of the heat sink 310 or the cooling component 104. Since the first end portion 122 has a first curved surface 122A and the second end portion 124 has a second curved surface 124A, each of the one or more beams 108 are able to rotate easily to contact the cooling component 104 and the heat sink 310 respectively.

In some examples, the contact force exerted by the elastomer component 106 may be regulated based on at least one of a physical property (e.g., stiffness), a physical dimension (e.g., height, width, length) of the elastomer component 106. Accordingly, the elastomer component's ability to get displaced (e.g., deform and bend) upon removable connection of the removable circuit device may cause the one or more beams to change their physical geometry without impacting the contact force. Accordingly, a cross-sectional area of the one or more beams 108 may be maximized to establish the thermally conductive pathway 148 and the heat conduction between the cooling component 104 and the heat sink 310, without the tradeoff of significantly higher contact force that multiple spring fingers may require to establish a thermally conductive pathway and heat conduction.

In one or more examples, the elastomer component 106 may exert an optimal contact force via each of the one or more beams 108 to allow easy plugging (e.g., inserting or sliding) of the removable circuit device 300 into the host circuit device 200. For example, the elastomer component 106 may displace and bend marginally upwards towards the cooling component 104 when the removable circuit device 300 is plugged into the host circuit device 200. However, the optimal contact force exerted by the elastomer component 106 via each of the one or more beams 108 may be sufficient to establish the thermally conductive pathway between the cooling component 104 and the heat sink 310. In other words, the elastomer component 106 may provide a multiplicity (array) of the contact force via each of the one or more beams 108 to create a substantially low insertion force for plugging the removable circuit device 300 to the host circuit device 200. In some examples, the multiplicity of the contact force is within acceptable safety limits to avoid repetitive force (e.g., insertion force or removal force) related injuries. In some examples, the amount of repetitive force that the removable circuit device 300 may require to removably connect to the host circuit device 200 or disconnect from the host circuit device 200 may be about 20 pound-force. The contact force exerted by the elastomer component 106 via each beam 108 may be in a range from about 0.01 pound-force to 3.0 pound-force. In some examples, the elastomer component 106 may displace upwards towards the cooling component 104 in a range from about 0.3 millimeter to 1.5 millimeter to allow easy plugging-in (insertion) of the removable circuit device 300 to the host circuit device 200.

In one or more examples, the elastomer component 106 may maintain the multipoint contact with the cooling component 104 and the heat sink 310 via one or more beams 108, even though the interfacing surfaces have a non-smooth surface, a non-flat surface, surface imperfections, or debris, because the elastomer component 106 may exert optimal contact force via each beam 108 to establish the thermally conductive pathway 148 between the cooling component 104 and the heat sink 310. It may be noted herein, that the interfacing surfaces may refer to i) an upper surface of the heat sink 310 and ii) a bottom surface of the cooling component 104.

During the operation, the plurality of electronic components 306 of the removable circuit device 300 may transmit, receive, process, or store data. Accordingly, the removable circuit device 300 may produce waste heat. In some examples, the removable circuit device 300 may produce the waste heat of about 20 joules per second. In such examples, the inner surface 320 of the heat sink 310, which is thermally coupled to the plurality of electronic components 306 may transfer the waste heat from the plurality of electronic components 306 to the outer surface 322 of the heat sink 310. Further, the second thermal contact 146 formed between the outer surface 322 of the heat sink 310 and the second end portion 124 of each of the one or more beams 108 (i.e., by way of dry contact surfaces) transfers the waste heat from the removable circuit device 300 to the thermal gap pad 102. The waste heat is further transferred from the second end portion 124 to the first end portion 122 via the angled body portion 126. Later, the first thermal contact 144 formed between the bottom surface of the cooling component 104 and the first end portion 122 of each of the one or more beams 108 (i.e., by way of a wet contact surfaces) transfers the waste heat from the thermal gap pad 102 to the cooling component 104.

The coolant may enter the cooling component 104 from the coolant inlet 136 (as shown in FIGS. 1C-1D), absorb waste heat from the body 130 (as shown in FIGS. 1C-1D) via the heat transfer features 134 (as shown in FIGS. 1C-1D), and may exit from the coolant outlet 138 (as shown in FIGS. 1C-1D), thereby cooling the cooling component 104. The heated liquid coolant may be pumped outside of the host circuit device 200 of the electronic device to exchange the heat with an external coolant (not shown) and regenerate the liquid coolant. Thus, in accordance to one or more examples of the present disclosure, the elastomer component 106 and the embedded plurality of beams 108 provide multipoint conduction cooling for an effective thermal management of the removable circuit device 300 and simultaneously overcome the problems related to multiple spring fingers.

FIG. 5 is a flow diagram depicting a method 500 of a thermal management of a removable device. It should be noted herein that the method 500 is described in conjunction with FIGS. 1A-1E, 2, 3, and 4A-4B, for example.

The method 500 starts at block 502 and continues to block 504. At block 504, the method 500 includes removably connecting a removable circuit device to a host circuit device, as described in FIGS. 4A and 4B. In some examples, the removable circuit device includes a circuit board, a plurality of electronic components disposed on the circuit board, and a heat sink thermally coupled to the plurality of electronic components. The host circuit device includes a host circuit board and a cooling assembly having a cooling component and a thermal gap pad including an elastomer component movably coupled to the cooling component and a plurality of beams embedded in the elastomer component. In some examples, removably connecting the removable circuit device to the host circuit device includes performing one of applying an insertion force to surpass a contact force applied by the elastomer component to establish the thermally conductive pathway, or applying a removal force to surpass the contact force to break the thermally conductive pathway.

Further, the method 500 continues to block 506. At block 506, the method 500 includes the step of communicatively connecting the circuit board to the host circuit board, as described in FIGS. 4A and 4B. In some examples, the block 506 includes inserting a plug of the circuit board belonging to the removable circuit device into a socket of a host circuit board belonging to the host circuit device to communicatively couple the circuit board to the host circuit board. The method 500 continues to block 508.

At block 508, the method 500 includes disposing a first end portion of each of one or more beams of the plurality of beams in a first thermal contact with the cooling component and a second end portion of each of the one or more beams in a second thermal contact with the heat sink to establish a thermally conductive pathway between the cooling component and the heat sink via each of the one or more beams, as described in FIGS. 4A and 4B. In one or more examples, the first thermal contact is formed between wet contact surfaces due to presence of the thermally conductive grease between the first end portion of each of the one or more beams and the cooling component. Further, the second thermal contact is formed between dry contact surfaces due to direct thermal contact between the second end portion of each of the one or more beams and the heat sink.

In some examples, establishing the thermally conductive pathway includes rotating the second end portion of each of the one or more beams to contact the heat sink and displace the elastomer component upwards towards the cooling component and moving each of the one or more beams upwards towards the cooling component by the elastomer component. Additionally, establishing the thermally conductive pathway includes rotating the first end portion of each of the one or more beams to contact the cooling component. Accordingly, the thermally conductive pathway is established between the cooling component and the heat sink. The method 500 ends at block 512.

Various features as illustrated in the examples described herein may be implemented in a system, such as a host device and method for a thermal management of a removable device. In one or more examples, the elastomer component maintains an optimal contact force via one or more beams while plugging the removable circuit device to the host circuit device, which is within acceptable safety limits to avoid repetitive force (e.g., insertion force or removal force) related injuries. Further, the elastomer component may be able to maintain the multipoint contact via the one or more beams with the removable circuit device and the cooling component, even though the surfaces of the cooling component and/or the heat sink has a non-smooth surface, a non-flat surface, surface imperfections, or debris.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A cooling assembly of a host circuit device, comprising:
   a cooling component; and
   a thermal gap pad comprising an elastomer component movably connected to the cooling component and a plurality of beams embedded in the elastomer component, wherein a first end portion of each of one or more beams of the plurality of beams is disposed in a first thermal contact with the cooling component and a second end portion of each of the one or more beams is disposed in a second thermal contact with a heat sink of a removable circuit device, wherein the second end portion of each of the plurality of beams includes an electrically insulating layer, wherein the elastomer component is an elastic and thermally non-conductive component, and wherein each beam of the plurality of beams is a non-elastic and thermally conductive component.

2. The cooling assembly of claim 1, wherein the elastomer component comprises a plurality of through-holes extending between a top surface and a bottom surface of the elastomer component, and wherein the plurality of beams are disposed in the plurality of through-holes to be embedded in the elastomer component.

3. The cooling assembly of claim 2, wherein each through-hole of the plurality of through-holes is an angled hole, and wherein each beam of the plurality of beams comprises an angled body portion that extends between the first end portion and the second end portion of a corresponding beam.

4. The cooling assembly of claim 2, wherein the first end portion of each of the plurality of beams protrudes beyond the top surface of the elastomer component, and wherein the second end portion of each of the plurality of beams protrudes beyond the bottom surface of the elastomer component.

5. The cooling assembly of claim 1, wherein the elastomer component comprises at least one of silicone, rubber, foam, or thermoplastic polyurethane material, and wherein each beam of the plurality of beams comprises at least one of copper, aluminum, or an alloy.

6. The cooling assembly of claim 1, wherein the first end portion of each of the plurality of beams has a thermally conductive grease to establish the first thermal contact with the cooling component, and wherein the second end portion of each of the plurality of beams has a dry contact surface to establish the second thermal contact with the heat sink.

7. The cooling assembly of claim 1, wherein the plurality of beams are discrete beams, and wherein the discrete beams are arranged adjacent to each other along a lateral direction and a longitudinal direction of the elastomer component to form an array of beams.

8. The cooling assembly of claim 1, wherein a contact force is exerted by the elastomer component on the heat sink via the plurality of beams when the removable circuit device is removably connected to the host circuit device, and wherein the contact force is regulated based on at least one of a physical property or a physical dimension of the elastomer component.

9. The cooling assembly of claim 1, wherein the first end portion of each of the plurality of beams has a first curved surface and the second end portion of each of the plurality of beams has a second curved surface, and wherein, when the removable circuit device is removably connected to the host circuit device: i) the second end portion of each of one or more beams of the plurality of beams rotates to contact the heat sink and displace the elastomer component upwards towards the cooling component, ii) the elastomer component moves each of the one or more beams upwards towards the cooling component, and iii) the first end portion of each of the one or more beams rotates to contact the cooling component and establish a thermally conductive pathway between the cooling component and the heat sink via each of the one or more beams.

10. A circuit assembly comprising:
    a removable circuit device comprising a circuit board, a plurality of electronic components disposed on the circuit board, and a heat sink thermally coupled to the plurality of electronic components; and
    a host circuit device comprising a host circuit board and a cooling assembly, wherein the removable circuit device is removably connected to the host circuit device, wherein the cooling assembly comprising:
       a cooling component; and
       a thermal gap pad comprising an elastomer component movably connected to the cooling component and a plurality of beams embedded in the elastomer component;
    wherein, when the removable circuit device is removably connected to the host circuit device: i) the host circuit board is communicatively coupled to the circuit board and ii) a first end portion of each of one or more beams of the plurality of beams is disposed in a first thermal contact with the cooling component and a second end portion of each of the one or more beams is disposed in a second thermal contact with the heat sink to establish a thermally conductive pathway between the cooling component and the heat sink via each of the one or more beams,
    wherein the elastomer component is an elastic and thermally non-conductive component, wherein each beam of the plurality of beams is a non-elastic and thermally conductive component, and wherein the second end portion of each of the plurality of beams includes an electrically insulating layer.

11. The circuit assembly of claim 10, wherein the elastomer component comprises a plurality of through-holes extending between a top surface and a bottom surface of the elastomer component, wherein the plurality of beams are disposed in the plurality of through-holes to be embedded in the elastomer component, wherein each through-hole of the plurality of through-holes is an angled hole, and wherein each beam of the plurality of beams comprises an angled body portion that extends between the first end portion and the second end portion of a corresponding beam.

12. The circuit assembly of claim 10, wherein the elastomer component comprises at least one of silicone, rubber, foam, or thermoplastic polyurethane material, and wherein each beam of the plurality of beams comprises at least one of copper, aluminum, or an alloy-material.

13. The circuit assembly of claim 10, wherein a contact force is exerted by the elastomer component on the heat sink via the plurality of beams when the removable circuit device is removably connected to the host circuit device, and wherein the contact force is regulated based on at least one of a physical property or a physical dimension of the elastomer component.

14. The circuit assembly of claim 10, wherein the first end portion of each of the plurality of beams has a first curved surface and the second end portion of each of the plurality of beams has a second curved surface, and wherein, when the removable circuit device is removably connected to the host circuit device: i) the second end portion of each of one or more beams of the plurality of beams rotates to contact the heat sink and displace the elastomer component upwards towards the cooling component, ii) the elastomer component moves each of the one or more beams upwards towards the cooling component, and iii) the first end portion of each of the one or more beams rotates to contact the cooling component and establish the thermally conductive pathway.

15. The circuit assembly of claim 10, wherein the removable circuit device is a pluggable electronic device comprising one of a small form-factor pluggable (SFP) transceiver or a non-volatile memory express (NVMe) storage drive.

\* \* \* \* \*